(12) United States Patent
Tootoonian Mashhad et al.

(10) Patent No.: US 7,019,666 B2
(45) Date of Patent: Mar. 28, 2006

(54) ADAPTER FOR A METER

(75) Inventors: Mohammad Tootoonian Mashhad, Burnaby (CA); Stephen Geoffrey Jones, Delta (CA); Keith Richard Martin, Burnaby (CA)

(73) Assignee: Tantalus Systems Corp., Vancouver (CA)

( * ) Notice: Subject to any disclaimer, the term of this patent is extended or adjusted under 35 U.S.C. 154(b) by 344 days.

(21) Appl. No.: 10/164,394

(22) Filed: Jun. 10, 2002

(65) Prior Publication Data

US 2004/0061623 A1    Apr. 1, 2004

(51) Int. Cl.
*G08C 17/00* (2006.01)

(52) U.S. Cl. ............ 340/870.02; 324/157; 379/106.07

(58) Field of Classification Search ........... 340/870.02, 340/870.01; 361/659, 664; 324/110, 142, 324/157; 264/271.1, 259
See application file for complete search history.

(56) References Cited

U.S. PATENT DOCUMENTS 6,275,168 B1 * 8/2001 Slater et al. ........... 340/870.02
6,825,776 B1 * 11/2004 Lightbody et al. ..... 340/870.02

* cited by examiner

*Primary Examiner*—Michael Horabik
*Assistant Examiner*—Hung Dang (57) ABSTRACT

An adapter is interposed between a standard resource meter and its socket, to provide RF-capabilities. Communications between meter and adapter are effected by optical technology. The adapter has emergency battery back-up capabilities.

21 Claims, 6 Drawing Sheets

ADAPTER FOR A METER

FIELD OF THE INVENTION

This invention relates to meters that, among other capabilities, measure common resources, especially electrical energy.

BACKGROUND OF THE INVENTION

There are meters that, among other capabilities, measure common resources (herein, meant to include consumption of commodities like electrical energy, water, and gas). Standard meters, as understood in the electrical utilities business in the United States and herein, are those that conform to ANSI standard C12.10. This and other standards (and counterparts in jurisdictions around the world) dictate a host of restrictions, including the physical envelope or form factor, the dimensions, locations and materials for power pins, the permissible types of electrical connections with the meter, and similar items, for a one or multi-phase electricity measuring meter. The policy is to maximize safety and inter-compatibility of meters from different manufacturers. This ANSI standard in effect, prohibits or strongly discourages any electrical connection between the meter and anything else except for the power pins and grounds.

To make a standard meter a useful part of a network, it is desirable to provide it with extra functionality (e.g. RF communication) and ideally, to so provide by means of an easily releasably attachable adapter. It is also desirable that the overall footprint of the adapter be minimized (while still conforming to the standard) and yet be sufficiently large to house the desired extra functionality. The present invention addresses those objectives. And although the embodiment of the present invention described below is with reference to a standard electrical meter, certain aspects of it are not thereby restricted thereto, and are applicable to meters that measure other resources such as water and gas.

SUMMARY OF THE INVENTION

There is provided a resource metering system, comprising: (a) a resource meter that measures and provides information on the metered resource; (b) a meter socket connected to the resource to be measured; (c) an adapter interposed between said meter and said socket, having wireless communications means for transmitting messages; (d) means for sending said metered resource information from said meter to said adapter via electrically-isolated optical communications means.

There is also provided a method of sending information from a resource meter to an upstream station, comprising the steps of: (a) sending resource meter information by a first RF-communication technology; (b) receiving the sent information of step (a) and transforming it and sending it by an optical-communication technology; and (c) receiving the sent information of step (b) and transforming it and sending it by a second RF-communication technology.

There is also provided a method of sending information from a resource meter to an RF-transmitter mechanically coupled with the meter, comprising the steps of: (a) transforming the information into optical signals; (b) sending said optical signals over free space; and (c) transforming said optical signals into RF-signals.

There is also provided an electrical resource metering system, comprising: (a) a standard meter with power pins, that measures an attribute of the electrical resource presented at said pins, and provides information related to the resource or meter and its operating environment, based on said measured attribute; (b) a standard meter socket connectable to the electrical resource, having power contacts releasably couplable with said meter power pins; (c) adapter releasably interposable between said meter and said meter socket, having: (1) power coupling means for coupling said meter power pins to said socket power contacts; and (2) RF communications means for transmitting messages; and (d) optical communications means for sending said messages with said information, from said meter to said adapter via electrically isolated, optical communications means.

BRIEF DESCRIPTION OF THE DRAWINGS

A better understanding of the present invention can be obtained when the following detailed description of the preferred embodiment is considered in conjunction with the following drawings, in which.

DETAILED DESCRIPTION OF THE PREFERRED EMBODIMENT

Figure 1:
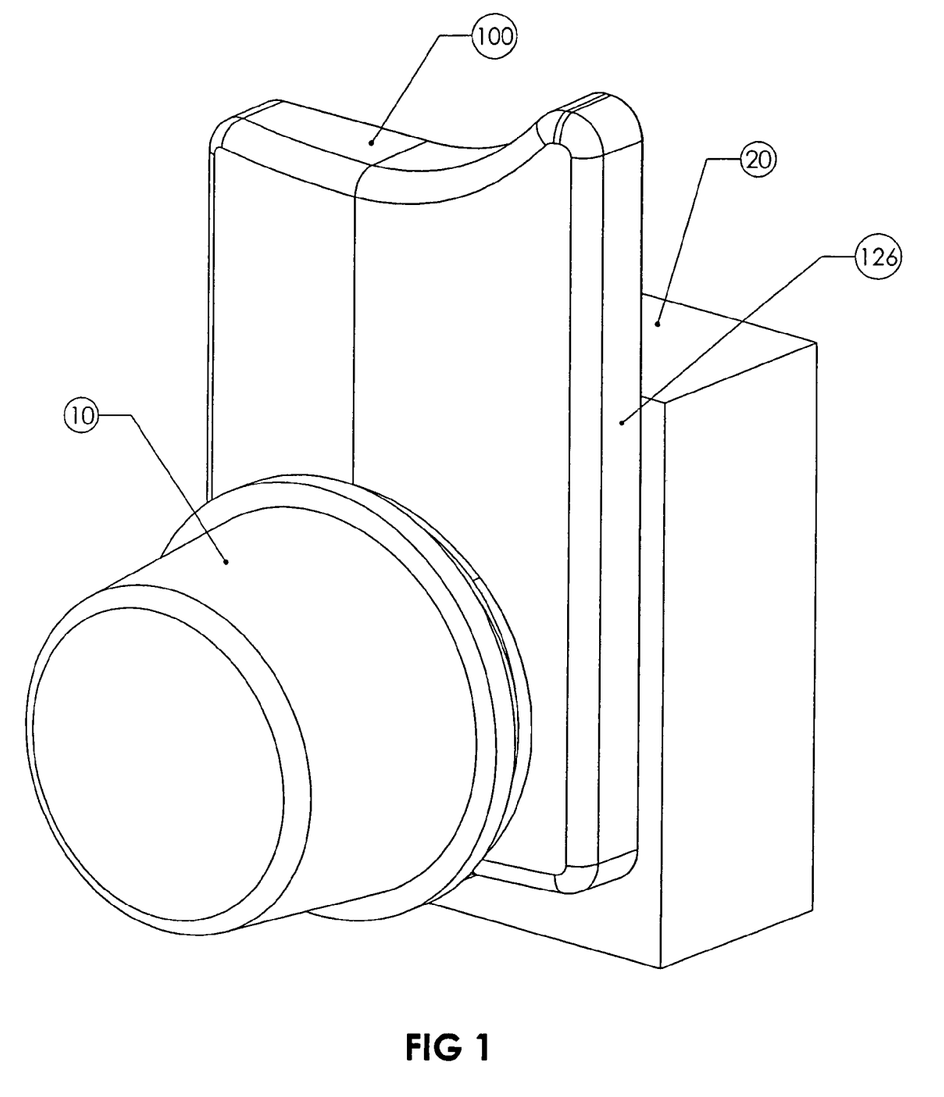
FIG. 1 shows a simplified perspective view of the adapter in attached combination with a meter and its socket.
Figure 5:
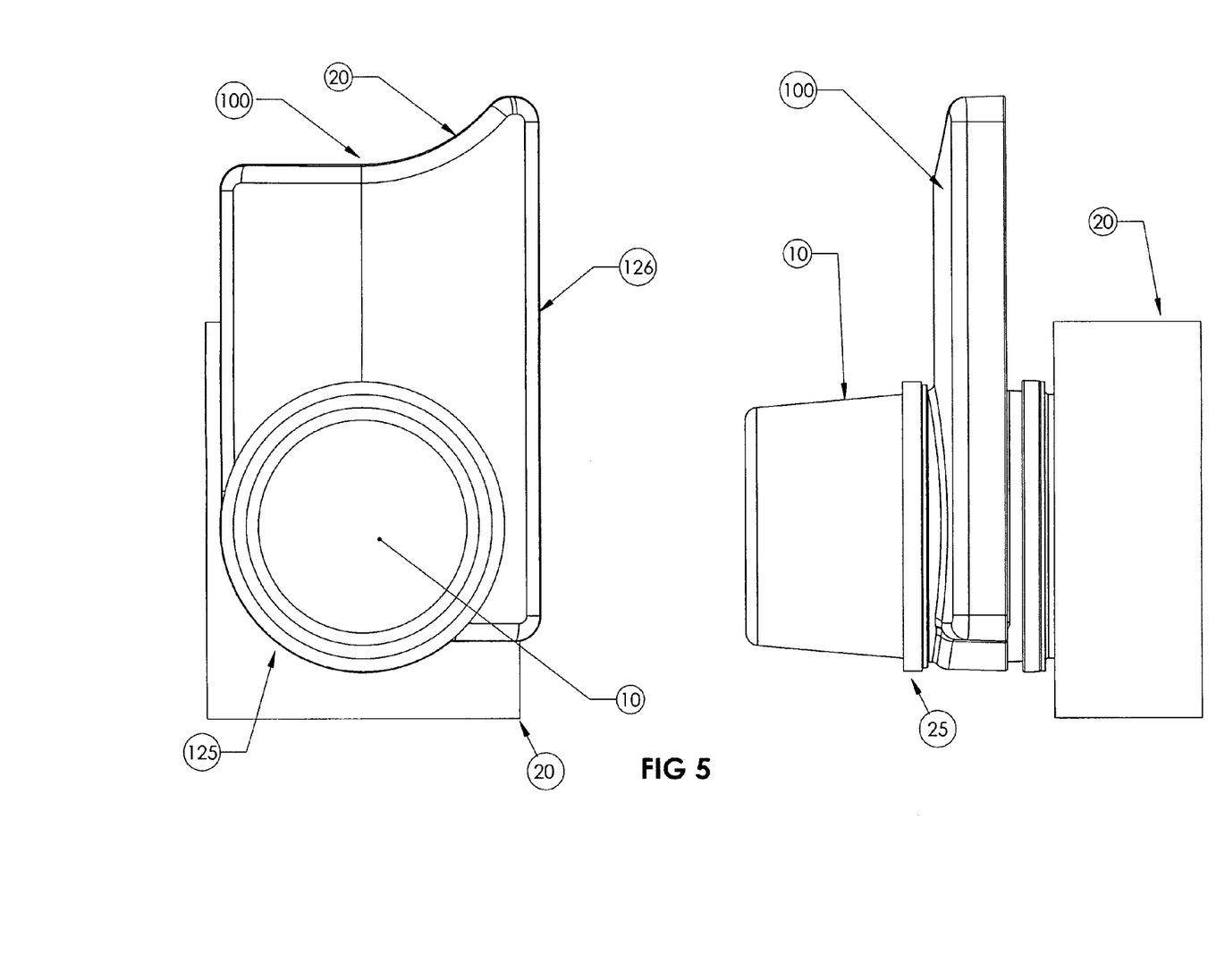
FIG. 5 shows a face and side view of the combination of FIG. 1, with dimensions.

As seen in FIGS. 1 and 5, adapter 100 is interposed between standard meter 10 (conforming to Form 2S of the ANSI standard, and augmented, as explained below) and corresponding meter socket 20, and provides RF communications functions for information relevant or related to meter 10 and its work.

Figure 3:
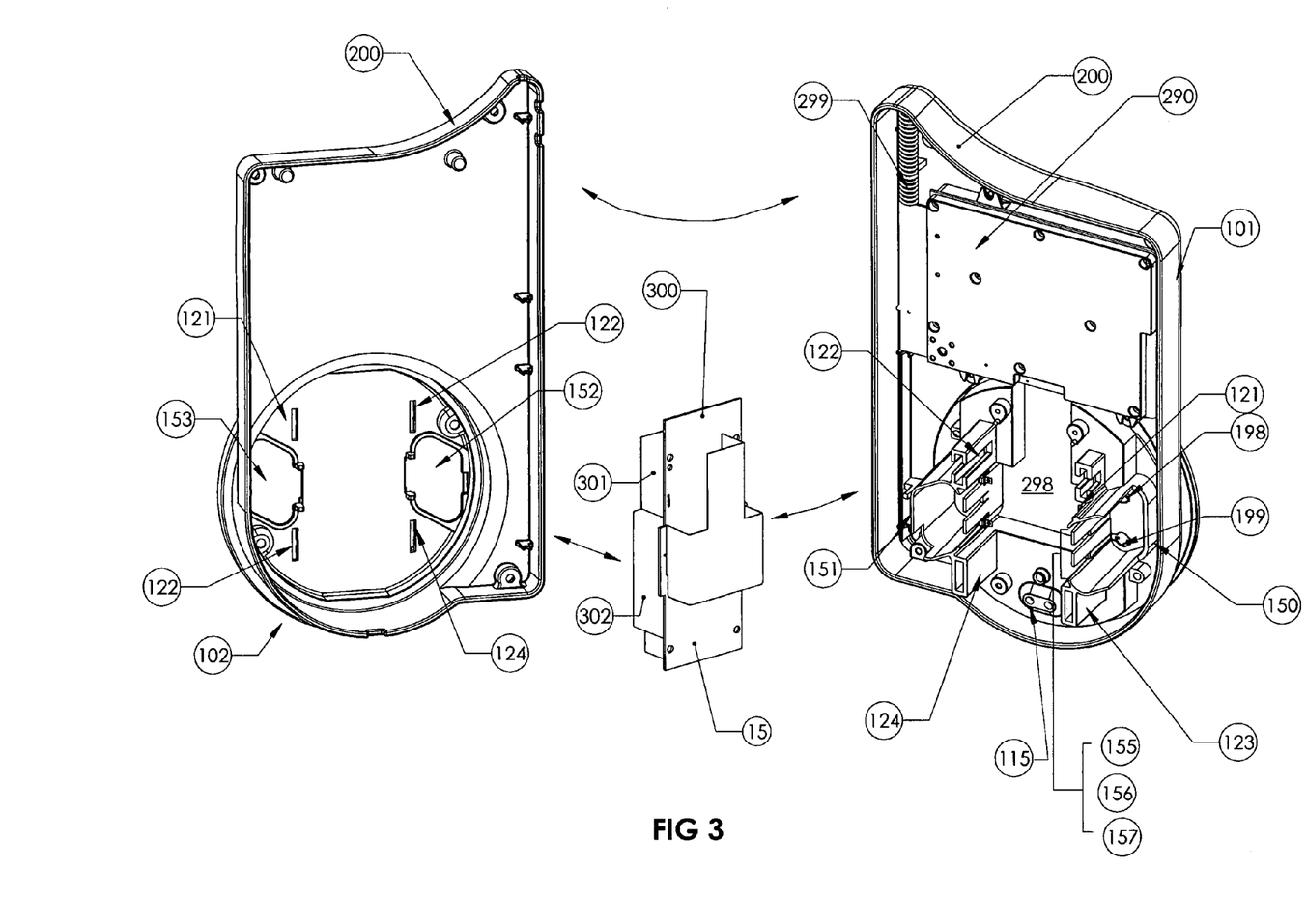
FIG. 3 shows a partially cut away view of the adapter and internal components.

Adapter 100 includes a weather-resistant enclosure or housing made of outer shells 101 and 102 (as seen in FIG. 3), which are attachable conventionally (by screws, weather-proofing paste, etc.) and are made of a suitable plastic.

Figure 2:
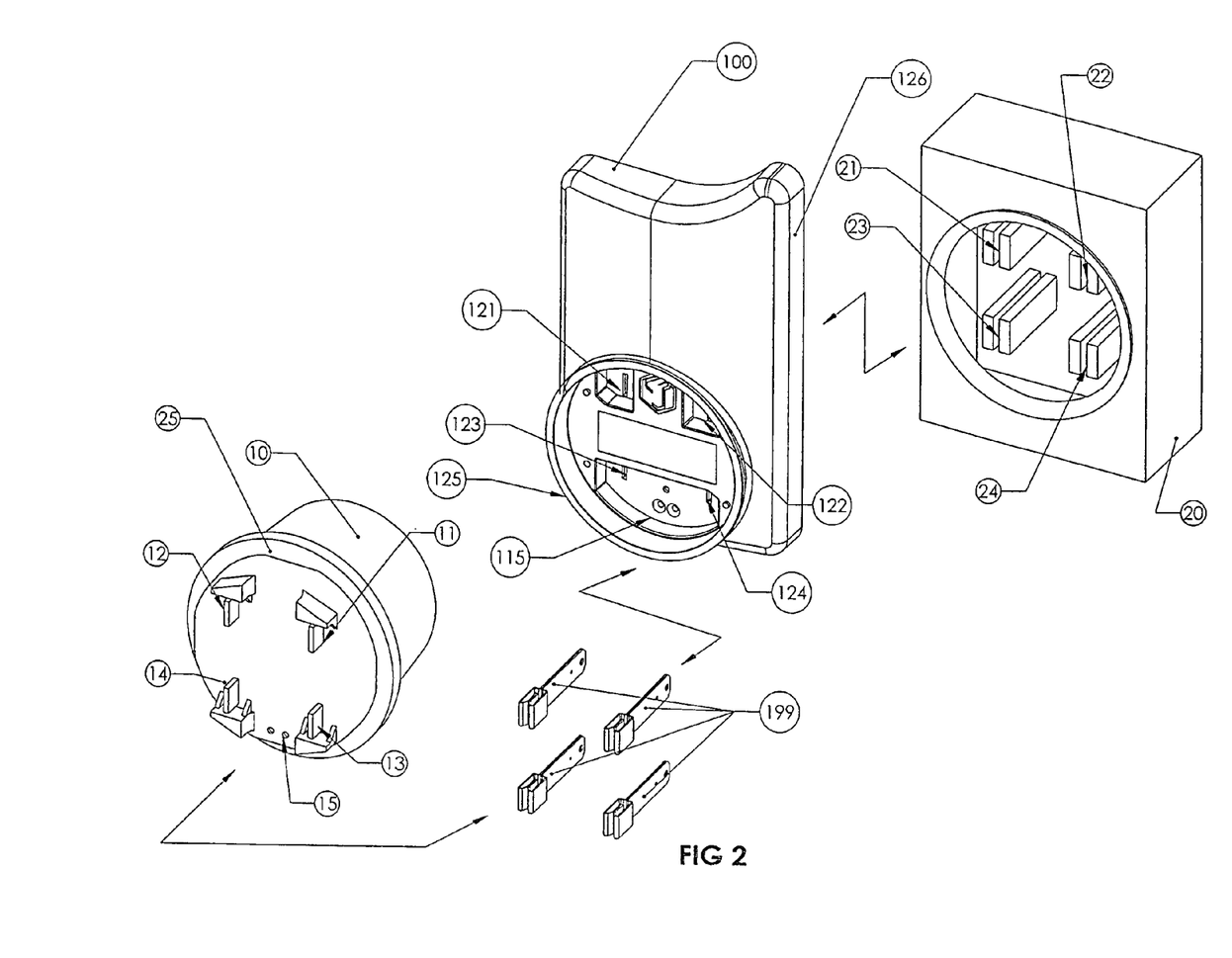
FIG. 2 shows an exploded view of the combination of FIG. 1.

Meter 10 has circular base 25 that releasably mates with a corresponding circular socket 125 on adapter 100. Similarly, adapter 100 has conventional circular base 25 that releasably mates with a corresponding mounting structure of meter socket 20. Conventional mating structures (such as gaskets, collars, rings, brackets, fastening elements, and the like) that provide a releasable, friction-fit mounting mechanism for interposing adapter 100 between meter 10 and socket 20, are not shown.

Power pin 199 (FIG. 2) has opposed standard jaw and blade end portions. Each of power pin slots 121, 122, 123 and 124 in adapter 100, receives a power pin 199, so that when meter 10, adapter 100 and meter socket 20 are combined (as shown in FIG. 1) and attached to subject electric power line (not shown), power pins 11, 12, 13 and 14 of meter 10, are taps of the power line through corresponding jaws 21, 22, 23 and 24 respectively of meter socket 20, through the electrical agency of four interposed power pins 199 of adapter 100. The jaws/pins mechanism can be any spring biased-finger or other mechanical mechanism sufficient to create a friction-fit bayonet-type of socket connection between each of adapter 100, meter 10 and socket 20 for tapping the subject power lines.

The functionality of adapter 100 includes wireless communications technology, power and optical technology, and finally an emergency battery back-up.

The wireless communications functions are effected by conventional RF communications technology, not shown in detail but is identified symbolically as RF module 290 in FIG. 3, with associated antenna 299. RF communications are carried out through modulation schemes, protocols and the like, which may be conventional or proprietary, and are as desired and implemented, and are in no way limited by this invention. RF module 290 can reside on board 300 (described below, where other adapter 100's functionality resides) but is advantageously kept as a separate module (as shown in FIG. 3) for purposes of shielding and of ease of assembly of adapter 100 for various customer applications (e.g. differing desired attributes of receiver, transmitter, transceiver functionality) and subsequent repair and upgrade procedures. RF module 290 is connected to board 300 (and to its optical module 302 and power transformer module 301) through conventional communications and power pin mechanisms (not shown), for easy attachment and separation.

Board 300 fits within cavity 298 of adapter 100, and carries power functionality and optical communications technology used for optical communications between adapter 100 and meter 10 (not shown in detail but power functionality and optical communications technology are identified symbolically as modules 301 and 302 respectively on board 300 in FIG. 3).

Board 300 is advantageously profiled to snugly fit between power pins 199 so as to conveniently tap power thereby for power transformer module 301. There is conventional circuitry for distribution of transformed power from module 301 appropriately to optical communications module 302 and RF communications module 290, and related functions. Adapter 100 has also an emergency battery backup (explained below).

Meter 10 may be of a traditional standard watthour meter type with additional optical functionality, as explained below. This type of standard meter typically measures an attribute of the electric resource by using measuring the rotations of an eddy current disk, whose rotational rate is proportional to the consumption on the power lines being metered. An example of this type of standard meter is the General Electric I70S1.

The function of "reading" from the watthour meter's disk/rotor is achieved by well-known disk/rotor-sensing optical techniques, typically involving providing a physical marker on the disk/rotor and sensing its rotations by conventional optical means (examples include U.S. Pat. No. 5,874,732 and the art referred to therein, U.S. Pat. Nos. 5,120,252, 6,232,885, 5,495,238).

Meter 10 is provided (not shown) an unobtrusive add-on in the form of aforementioned conventional electro-mechanical-optical technology (using a marked disk/rotor and infra-red LEDS and detectors and associated circuitry) to "read" rotations of the disk/rotor and generate a series of optical signals as a function of power consumption (measured by the disk/rotor and otherwise displayed on the front register dials of meter 10).

Furthermore, meter 10 is provided with an optical port 15 at the physical back end of meter 10 facing adapter 100 and provided with conventional technology to process the optical messages from aforementioned conventional electro-mechanical-optical technology, for transmission according to a communications protocol (like RS232), and to deliver to optical port 15 (with subsequent delivery to optical port 115 and optical communications module 302 on board 300, as explained below).

Meter 10 and adapter 100 communicate with each other, not through a direct electrical connection but through an electrically-isolated optical mechanism. Specifically, communications is effected between opposed ports 15 and 115 using conventional infra-red technology and protocols (like RS232). Each of ports 11 and 115 has a physical channel for transmitting and a physical channel for receiving optical signals. In the physical transmitting channel of port 15 of meter 10, there is an LED or other radiation emitter, and in the corresponding physical receiving channel of port 115 of adapter 100, there is a photo-transistor or other receptor. Similarly, the transmitting channel of port 115, there is an LED or other radiation emitter, and in the corresponding receiving channel of port 15, there is an appropriate receptor.

There is a small (in the order of 1 to 2 centimeters) free-space gap between the radiation emitter (e.g. LED) of the transmitting channel of one port and the corresponding detector diode of the receiving channel of the other port when meter 10, adapter 100 and meter socket 20 are combined (as shown in FIG. 1).

Optical module 302 has conventional technology for transforming optical signals from said disk/rotor electro-mechanical-optical technology in meter 10 (and sent via optical ports 15 and 115), into a form suitable for processing and transmission by RF module 290.

Going the other way, optical module 302 has conventional technology for transforming signals from RF module 290, into optical signals for transmission to meter 10. Accordingly, meter 10 is also provided conventional optical processing means and functionality regarding optical signals received at optical port 15 from port 115 of board 300.

Thus is provided bi-directional transfer of messages (whose contents are exemplified below) between meter 10 and adapter 100 (and in particular, its RF module 290 for communications with a network or simply an upstream entity having control and management functions over meter 10), without an electrical connection therebetween (except for power pins 199). As indicated earlier, any electrical connection with a standard meter other than through power pins and grounds are in effect prohibited or strongly discouraged by industry standards.

Messages from meter 10 typically include information related to consumption of the subject resource being measured (and in particular, information obtained from the aforementioned electro-mechanical-optical technology and indicative of consumption of resource metered). Messages from meter 10 also typically include particular attributes or parameters of the measurement (e.g. voltage levels, time of measurement), attributes of or related to meter 10 itself (e.g. serial #, ambient temperature, improper physical tampering, (in)sufficiency of power to operate meter 10) and any other information depending on application software and hardware as desired and implemented, none of which is limited by this invention.

Messages to meter 10 may be from an upstream controller and thus include commands (e.g. power meter 10 off/on) and information (e.g. controller's time for synchronization of meter 10's time with controller's time). Again, the types of messages and their handling is a function of application software desired and implemented, and is not limited by this invention.

Although power for adapter 100's functions is normally obtained by tapping the power lines, presented by power pins 199 explained above in association with power transformer module 301, an emergency battery facility is provided, as explained next in conjunction with FIGS. 3 and 4.

There is a pair of opposed battery bays 150 and 151 in the shape of parallepipeds (with bay 150 shown in partially cut away view in FIG. 3) that house battery packs 160 (explained below). Shell 102 has snap-lock doors 152 and 153 for battery bays 151 and 150 respectively, for ease of insertion/replacement of battery pack 160 without otherwise opening adapter 100. Battery bay 150 has insertable/removable battery clips 198 and 199 that connect battery pack 160 (when inserted in bay 150) with corresponding terminals on board 300. Because battery bay 151 is identical to bay 150 (as will be explained later) and optional, the following explanation will concentrate on bay 150. There is conventional circuitry on board 300 for detection of insufficient power from power pins 199 and for switching to emergency back-up to be provided by battery pack 160.

One wall of battery bay 150 has three indents 155, 156 and 157 each profiled to receive snugly a battery clip, and spaced with respect to each other to correspond to each of the three "battery slots" closest to battery pack 160 (as seen in FIG. 3 and as will be explained below. Battery clips 198 and 199 are located in outer indents 155 and 157, and are for opposed polarities (positive/negative). The electrical contacts of battery clips 198 and 199 are at the base of bay 150 for meeting corresponding exposed contacts of contact face side 162 of battery pack 160 when inserted into bay 150 (explained below).

Figure 4A:
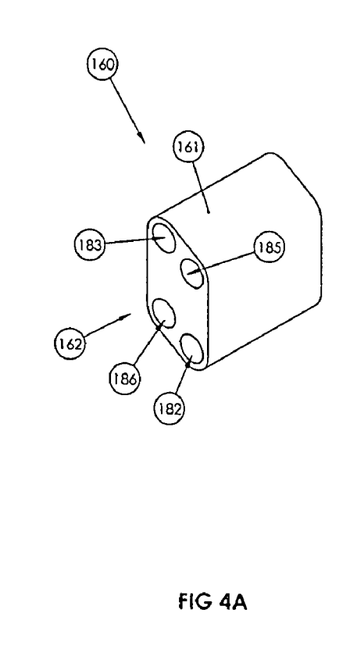
FIG. 4A shows a perspective view of a battery pack, showing exposed contacts.
Figure 4B:
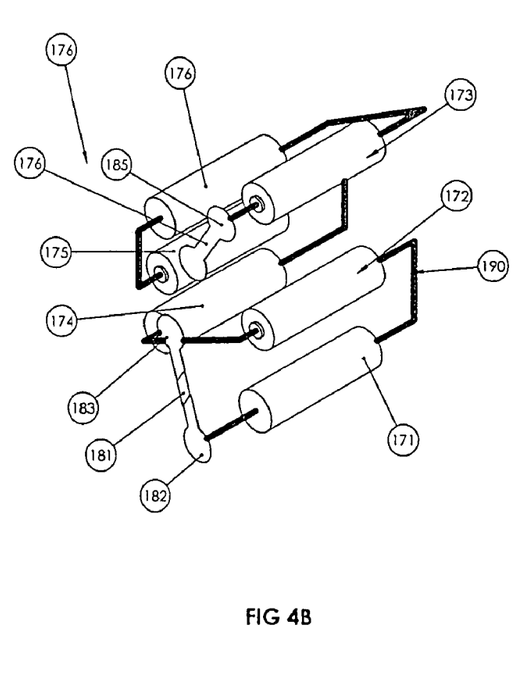
FIG. 4B shows the symbolic serial connection of the batteries of the pack of FIG. 4A.
Figure 4C:
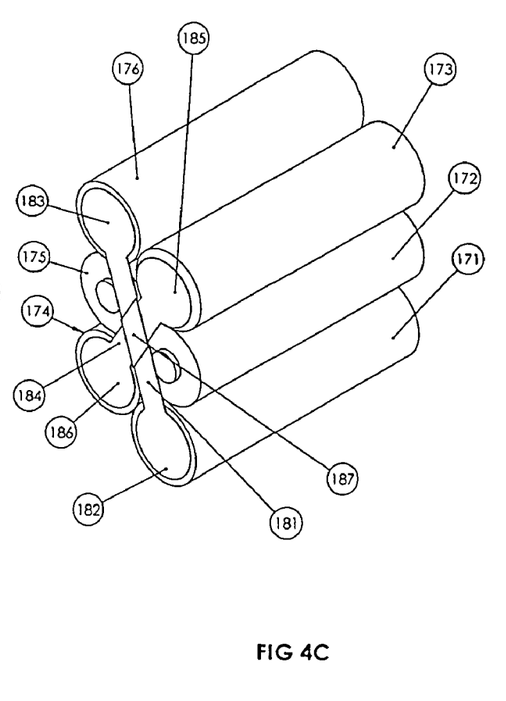
FIG. 4C shows the physical relationship of the batteries of FIG. 4B when packed.

As shown in FIGS. 4A, 4B and 4C, battery pack 160 may be 3×2 AA batteries 171, 172, 173, 174, 175 and 176 (each of conventional standard or rechargeable kind), bundled into a rigid parallelepiped shape (basically a "left" column of three AA batteries with a "right" column of three AA batteries displaced slightly in a direction transverse to the battery pack insertion axis into bay 150, to create a slight overlapping, packing relationship). This bundle of six batteries forming battery pack 160, fills six notional "battery slots" in battery bay 150 upon insertion therein. The physical bundling is effected by a soft plastic (or other electrically insulated) wrap 161 (shown symbolically in FIG. 4A) accomplished by conventional techniques. Wrap 161 covers almost all of pack 160, leaving only one "contact face side" 162 that is "electrically open" with four contacts {185, 182}, {183, 186} exposed for connection with the positive/negative contacts presented by battery clips 198 and 199 of battery bay 150. The side of pack 160 that is opposed to side 162 is completely covered by wrap 161 and has no portion thereof exposed for electrical contact. Battery bay 150 and battery pack 160, as shown in FIGS. 3 and 4, will be referred to as having a "right slanted" orientation, meaning that, when viewed in cross-section, (i.e. axially into the batteries as they are inserted into battery bay 150, down the axis of insertion therein, with contact face side 162 remote from the workman inserting battery pack 160 and facing battery bay clips 198 and 199), the parallelogram appears slanted or tilted to the upwardly right; and where a "left slanted" orientation (not shown) refers to a battery pack/bay parallelepiped configuration which appears slanted or titled to the upwardly left.

The electrical connections that serially connect six batteries of battery pack 160 in the sequence—{171, 172, 174, 175, 176 and 173}— are shown symbolically in dark black line 190 in FIG. 4B (with the positive terminal of battery 171 being the positive terminal of the series and thus of battery pack 160; and the negative terminal of battery 173 being the negative terminal of series and thus of battery pack 160). In practice, conventional "wiring" is employed to effect the serial connections. Of course, it is possible to have serial connections other than the sequence of batteries shown, and to have other schemes of exposed contacts other the four corner ones shown. In any case, it is advantageous to arrange to have opposed corners both on one side of the parallelepiped (e.g. 182 and 185, or 183 and 186) to be the positive/negative terminals of the series and thus of battery pack 160 (instead of, e.g., opposed kitty corners of the obtuse angles of the parallelogram). Note that FIG. 4B shows only the symbolic serial connections between the individual batteries—it does not show the interaction between the batteries and the battery clips 198 and 199 in battery bay 150, to be explained below in conjunction with contact bands 181 and 184 of FIG. 4C.

FIG. 4C is the assembled version of FIG. 4B (i.e. omitting the physical serial connections of FIG. 4B) and shows, relative to the batteries, the location of contact band 181 (with opposed end contacts 182 and 183) and contact band 184 (with opposed end contacts 185 and 186). Although contact bands 181 and 184 cross physically (one on top of the other), they are electrically insulated from each other (by plastic or other electrically insulated sheath 187 around contact band 181 where it crosses contact band 184).

The purpose of contact bands 181 and 184 is to provide, once battery pack 160 is inserted into bay 150, an effective electrical connection regardless of the orientation of battery pack 160 in battery bay 150.

Although end contact 183 resides "on top" of battery 176, it is electrically connected to end contact 182 and thus to the negative terminal of battery 171. Similarly, although end contact 186 resides "on top" of battery 174, it is electrically connected to end contact 185 and thus to the positive terminal of battery 173. Thus when battery pack 160 (as shown in FIG. 4A) is inserted into battery bay 150, end contact 182 (negative) and end contact 185 (positive) are physically and electrically in appropriate contact with battery clips 199 (positive) and 198 (negative) respectively. If battery pack 160 were rotated 180 degrees about its longitudinal battery axis of insertion into battery bay 150, from the orientation shown in FIG. 4A, and then inserted into battery bay 150, end contact 183 (negative) and end contact 186 (positive) are physically and electrically in appropriate contact with battery clips 199 (positive) and 198 (negative) respectively. Thus, regardless of the orientation of battery pack 160, once it is inserted physically into battery bay 150, the desired electrical connection is effected.

Battery pack 160, so constructed and once inserted into battery bay 150, will be electrically effective regardless of its orientation (i.e. it is physically impossible to insert pack 160, so constructed, into bay 150 in a way that is electrically ineffective). Without the aforedescribed configuration of contact bands 181 and 184 or equivalent, it is possible to insert a battery pack incorrectly into a battery bay (both being parallelepiped in shape), perhaps in haste, only to detect (if at all) later and disadvantageously, the resulting non-conducting status (e.g. after the workman has left). For example, if battery pack had only two exposed contacts (e.g. pair of end contacts 182 and 185 without any contact bands or equivalent), then there are two possible ways of inserting such a battery pack into bay 150 and one of them will be electrically ineffective and the other will be electrically effective.

The shape of battery bay 150 (and corresponding battery pack) and its location are designed so that maximum battery capacity is provided for, within the envelope constraints of Form 2S. The location of power pin slots 121, 122, 123 and 124 are dictated by standardized locations for the power pins 11, 12, 13 and 14. Hence, the shape and location of a battery bay must fit the physical constraints created thereby. One wall of battery bay 160 fits between power pin slots 121 and 123.

A second battery bay 151 is optionally provided to house a second battery pack 160 that may be desirable according to specific application requirements. Bay 151 is identical to bay 150 in shape and orientation (as shown in FIG. 3, both bays 150 and 151 are "right-slanted" when viewing down the battery insertion axis) and bay 151 is in effect a "copy" of bay 150 rotated about an axis centered transversely to adapter 100. Bay 151 has indents and clips as described above for bay 150. Where both bay 151 and bay 150 are oriented the same way (i.e. both "right slanted"), as shown in FIG. 3, then advantageously battery pack(s) 160 can be inserted into either or both. Where bay 151 is oriented differently than bay 150 (e.g. bay 151 is "left slanted" and bay 150 is "right slanted"), then obviously (and easily but still disadvantageously), a "left slanted" battery pack must be provided for physical insertability into bay 151.

Bay 150 shown in FIG. 3, is for a pack of six AA batteries but it may be that for some applications, only five batteries are needed or desired, in which case, one "battery slot" is filled with a cylindrical AA size "dummy" (not shown). Providing an electrically effective "dummy" obviates the need to provide its own serial connection that differs from that used for the six batteries battery pack situation. Alternatively, the "dummy" is a non-conductor and then the serial connection can be redesigned to serially connect the five AA batteries so the positive and negative terminals of battery pack 160 remain electrically the same as the six batteries battery pack case described above.

Bay 150 shown in FIG. 3, is for a battery pack 160 of six AA batteries but it may be that for some applications, only four batteries are needed or desired. In the case of a four batteries battery pack in the shape of a rhomboid, clip 199 may be placed in indent 156 (instead of indent 157) and clip 198 remains in indent 155, to provide the negative/positive terminals. With such a battery packing taking up only four "battery slots" in bay 150, filler or "dummy" as described above is required to fill physically the remainder of bay 150.

Note the advantage of a "non-square" parallelepiped shape over a "square" prism battery pack/bay, where "square" and "non-square" are viewed down the battery axis of insertion into the bay. With a "square" prism battery pack, there are four orientations that will allow physical acceptance into a corresponding "square" battery bay (each orientation being a 90 degree rotation from the previous). In contrast, the asymmetry of this invention's "non-square" battery pack means that, in the case of the parallelogram, only two orientations (each 180 degrees from the other) will allow physical acceptance into the corresponding parallelepiped bay, and both those orientations will result in an electrically effective configuration.

For best transmission and reception performance, an antenna ideally protrudes some distance from the electronic and related infrastructure. Also, the meter 10 and socket 20 combination is often found in residential settings, where there is the risk of mischief and the temptation to use a protrusion for purposes inappropriate for the meter.

Accordingly, as seen in the FIGS. 1–3 and 5 adapter 100 is profiled (with smooth protruding portion 200) to accommodate antenna 299 within itself (to protect antenna 299 from physical damage, e.g. falling debris or vandalism) and to discourage someone from using it for an inappropriate purpose (e.g. as a hook to hang a clothesline or other improper load on).

A columnar or other prismatic protrusion that meets the remainder of adapter 100 at a right or sharp angle, would invite, encourage and assist the inappropriate use of that protrusion. In contrast, the smoothness of the connection of protruding portion 200 to the rest of adapter 100 will discourage (by sight and by physical effect) such inappropriate use. As seen in drawings (and especially FIG. 5), when viewed from the front, one wall of portion 200 is flush with the side wall of the remainder of adapter 100, and the top surface of portion 200 is a gentle downward slope that smoothly meets the top of adapter 100, and the front facing and back sides of portion 200 have their top edge defined by that same downward slope. To continue the example above, it would be difficult to securely tie a clothesline around portion 200—any rope pulled against the slope and its defining edges, would tend to be lifted by the reaction thereto. In addition to the utilitarian advantages of smoothly protruding portion 200, its resemblance to a shark or orca fin, provides aesthetical or ornamental attractiveness to adapter 100 in what is typically a very mundane visual setting.

To assist workmen, it is desirable to expose as much of the circular portion of meter 10 as possible for physical gripping and manipulation (e.g. use of gripping rings and collars and other items necessary to install and service meters). Hence, adapter 100 is shaped so that at least one side wall ends at its lower extremity, tangentially to circular socket 125, thus exposing at least one quarter arc of meter 10 (and specifically its base 25) when meter 10 is inserted into adapter 100, as best shown in FIG. 5. The opposed side wall 126 may terminate at its lower extremity above the bottom of circular socket 125, again exposing another portion of base 25 of meter 10 when meter 10 is mounted onto adapater 100.

Because adapter 100 is typically exposed continuously to adverse weather conditions (rain, extreme heat and cold), the weather-resistant fit of shells 101 and 102 is important.

During the manufacturing process, for testing the quality of fit between shells 101 and 102, talcum powder is sprinkled over the interior surfaces of shells 101 and 102. Then shells 101 and 102 are attached, exposed to various adverse weather conditions (shower or submerged in water simulating a severe weather storm) and then opened for inspection. Any moisture that leaked through the fit of shells 101 and 102, will likely create a readily visible trace in the talcum powder coating. Herein, "powder" includes talcum powder and any other powder having properties similar to talcum power, namely modest stickiness to a suitable plastic surface that is also visibly reactive to moisture.

As well, adapter 100 in final form of manufacture (i.e. ready to be shipped for use) can have its interior surfaces of shells 101 and 102 coated with powder. Later, if adapter 100 is not working properly, the possibility of leakage can be easily investigated by observing traces of the powder's reaction with any moisture.

Also, meter 10 may be part of a network with other like resource meters, perhaps all under the control of an upstream controller. With meter 10 as part of a network, adapter 100's RF module 290 may be equipped with functionality to receive information from other resource meters that is of the same type as the information received from meter 10 mentioned above, and to re-transmit to other parts of the network (in effect, adapter 100 acts as a relay station in a network of resource meters).

Alternatively, adapter 100's RF module 290 may receive information from another resource meter indirectly, as follows.

Figure 6:
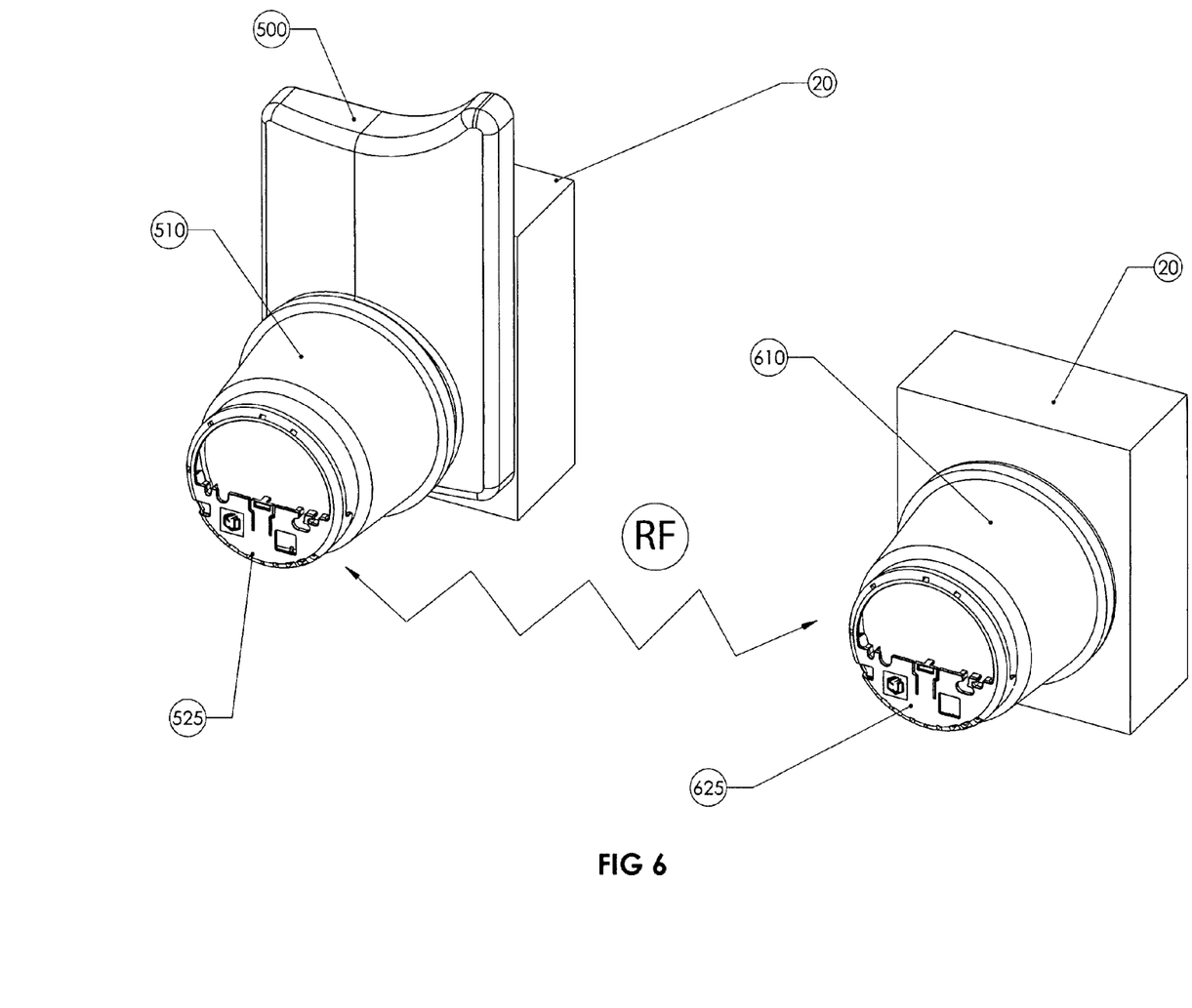
FIG. 6 shows a network of resource meters and adapter.

As seen in FIG. 6, in a network of resource meters, meters 510 and 610 are standard meters that are augmented with extra functionality beyond that described above in conjunction with FIGS. 1 to 5.

Meter 610 is meter 10 augmented with RF transmission capabilities 625 using a first RF technology, and related functionality (which is attached to the existing face of meter 10 under the glass cover, e.g. Itron 40ER-1). Thus augmented, meter 610 measures the resource to which its socket 20 is attached, and transmits (using a first RF technology) measurements to RF-receiver 525 of meter 510, explained next.

Meter 510 has RF-receiver 525 using the same said first RF technology, that receives signals from RF transmitter 625 and transforms them into optical signals for optical transmission to adapter 500 via ports 15 and 115 (as described above for signals from the electro-mechanical-optical technology of meter 10). RF-receiver 525 is basically the receiving counterpart of RF transmitter 625 and is attached to the front face of meter 510 under its glass cover. Adapter 500 is basically adapter 100 augmented with extra functionality to transform such optical signals from port 115 (i.e. an optical version of the RF signal from meter 610), into a second RF technology, being the incumbent RF technology of module 290. This transformation processing can be done in an augmented RF module 290 or some other module on board 300, both within adapter 500. Alternatively, the transformation into the second RF technology can be accomplished by extra functionality to RF-receiver 525 so that the signals arriving at port 115 are optical versions of the second RF technology and suitable for transmission "as is" by RF module 290.

In one particular type of network, adapter 500's RF module 290 operates in a frequency range having good long distance qualities (e.g. a Wide Are Network in the 220 MHz range)) while RF communications between meter 510 and 610 operate in a frequency range more suitable for shorter distances (e.g. a Local Area Network in the 433 MHz range). Meters 510 and 610 may be located in neighboring houses operating under a LAN, while adapter 500 may seen as the gateway for resource information between that LAN and some upstream controller or base station operating under a WAN.

Thus in the network context, it is seen that meter 510 can function as "collector" or concentrator of RF communications of other resource meters, as well performing its own measurement and transmission functions as described above in conjunction with meter 10.

Thus it is seen that information from resource meter 610 is transformed into a first form (a first RF domain), then into a second form (optical signals domain) and then into a third form (a second RF domain).

The reverse process is of course possible. RF-module 290 in adapter 600, RF-receiver 525 in meter 510 and RF-transmitter 625 in meter 610, can be augmented to be transceivers, so that, for example, messages from an upstream controller, can be sent to meter 610 through the intermediate operations of adapter 500 (transforming the message from its incumbent RF technology into an optical form, sending optically to meter 510, which then transits to meter 610 using the second RF technology. Messages from the upstream source may include commands (e.g. power meter 510/610 off/on) and information (e.g. controller's time for synchronization of meter 510/601's time with controller's time). Again, the types of messages and their handling is a function of application software desired and implemented, and is not limited by this invention.

Although a battery pack using a plurality of conventional AA batteries is disclosed (for ease of use and replacement for years to come), this invention is not so limited. A specially designed/manufactured battery pack (perhaps a unitary battery that is profiled to fit the parallelpiped-shaped battery bay 150 as shown in FIG. 3, is possible or desirable to meet performance requirements. Also, to fit another, related power pin configuration (Form 3S, for example), battery pack and battery bay should be profiled appropriately and so other types of batteries and shapes may be appropriate.

References herein to a suitable plastic for the housing of adapter 100 (and in particular, shells 101 and 102) may be to polycarbonate plastic or any other material having similar physical properties, such as those related to robustness, rigidity, temperature sensitivity, and electrical insulation.

Although the free-space separation between the opposed optical ports 15 and 115 described above is very small (in the order of 1 to 2 centimeters), it need not be necessarily small. The important attribute to achieve is an electrically-isolated way of communicating between the meter and adapter.

The embodiment described above in conjunction with FIGS. 2–3, provides for bi-directional transfer of messages between meter 10 and adapter 100 (and in particular, its RF module 290 for wireless communications to and from an upstream or downstream station in a network). Of course, a unidirectional embodiment (where messages were only sent from meter 10 upstream without reception of any messages) is merely a simplification of the described embodiment.

Although a transmitting channel and a receiving channel have been explained for each of optical ports 15 and 115, a simpler version is possible, where optical port 15 has only a transmitting channel, and port 115 has only a receiving channel, so that only messages are transmitted upstream from meter 10—no messages are received by meter 10 from any upstream source. The information transmitted would typically relate to consumption of the subject resource being measure, attributes thereof (e.g. voltage levels, time of measurement), attributes of or related to meter 10 itself (e.g. serial #, ambient temperature, improper physical tampering, (in)sufficiency of power to operate meter 10) and any other information depending on application software and hardware as desired and implemented, none of which is limited by this invention.

The preferred embodiment has been described with reference to the GE IS70 meter. Extra-functionality (electro-mechanical-optical technology) is added unobtrusively to meter 10 of the GE IS70 disk/rotor type. It is understood by those in the art that this invention can be applied also to standard conventional electronic meters, such as the Schlumberger Centron. In such cases, meter 10 need only be provided suitable means to read electronic signals otherwise created by such meters as indicative of consumption and to transform into a series of optical signals for transmission via port 15.

Although the embodiment described relates to a standard electrical power meter conforming to Form 2S, this invention is applicable to other standard meters (such as Form 3S and 4S) where only obvious modifications are necessary to accommodate a different socket/power pin arrangement. Also, it is understood by those in the art that this ANSI standard is unlikely to be modified substantially in the future but if it is modified slightly, it will be readily apparent to those in the art that this invention may be easily adjusted accordingly to fit the amended envelope or form factor. It would be a matter of simple design.

Although the method and apparatus of the present invention has been described in connection with the preferred embodiment, it is not intended to be limited to the specific form set forth herein, but on the contrary, it is intended to cover such alternatives, modifications, and equivalents, as can be reasonably included within the spirit and scope of the invention as defined by the appended claims. All figures are drawn for ease of explanation of the basic teachings of the present invention only; the extensions of the figures with respect to number, position, relationship, and dimensions of the parts to form the preferred embodiment will be explained or will be within the skill of the art after the following teachings of the present invention have been read and understood. Further, the exact dimensions and dimensional proportions to conform to specific force, weight, strength, and similar requirements will likewise be within the skill of the art after the following teachings of the present invention have been read and understood.

We claim:

1. An electrical resource metering system, comprising:
   (a) a standard meter with power pins, that measures an attribute of the electrical resource presented at said power pins, and provides information related to the resource or meter and its operating environment, based on said measured attribute;
   (b) a standard meter socket connectable to the electrical resource, having power contacts releasably couplable with said power pins;
   (c) adapter releasably interposable between said meter and said meter socket, having:
      (1) power coupling means for coupling said power pins to said socket power contacts; and
      (2) RF communications means for transmitting messages; and
   (d) optical communications means for sending said messages with said information, from said meter to said adapter via electrically isolated, optical communications means.

2. The system of claim 1, wherein said optical communications means further includes means for sending messages from said adapter to said meter via electrically isolated, optical communications means.

3. The system of claim 2, wherein said standard meter has a disk mechanism whose rotation is indicative of an attribute of the resource presented at said power pins, further comprising optical transformation means, connected to said optical communications means, for reading the rotation and transforming it into a sequence of optical signals.

4. The system of claim 2, wherein said standard meter has means for producing a sequence of electronic signals indicative of an attribute of the resource presented at said power pins, further comprising optical transformation means, connected to said optical communications means, for reading the rotation and transforming it into a sequence of optical signals.

5. The system of claim 3, wherein said adapter further comprises means for transforming said optical signals into a form appropriate for processing by said RF communications means.

6. The system of claim 5, wherein said optical communications means comprises a pair of opposed light radiator and light detector for sending and receiving respectively, said optical signals.

7. The system of claim 6, wherein said light radiator is located at the back of said standard meter and said light detector is located at the front of said adapter.

8. The system of claim 7, where said adapter RF communications means has means to receive a message.

9. The system of claim 8, further comprising an upstream station with RF communication means that has messages to send to said meter adapter's RF communications means.

10. The system of claim 9, further comprising another station that has information about another resource meter and that has a RF transmitter to send that information to said meter adapter's RF communications means.

11. The system of claim 10, wherein said adapter has an antenna connected to said RF communications means, and the outer shape of said adapter is profiled to enclose said antenna with a smooth surface having no sharp angles.

12. The system of claim 11, wherein said adapter has a first battery bay and a corresponding first battery pack, both being in identical, approximate parallelepiped shape, for insertably housing said first battery pack in said first battery bay.

13. The system of claim 12, wherein said first battery pack comprises a plurality of cylindrical batteries connected in series.

14. The system of claim 13, wherein said first battery pack has six batteries arranged in two columns of three batteries each.

15. The system of claim 14, wherein said first battery bay has two battery clips of opposite polarities, and said first battery pack has a plurality of exposed contacts arranged in pairs of opposite polarities, whereby regardless of orientation of said first battery pack within said first battery bay, said first battery bay clips and said first battery pack contacts are in alignment for electrical connection.

16. The system of claim 15, wherein two of said first battery pack exposed contacts are two effective terminals of opposite polarities, with another two contacts-being connected to said effective terminals.

17. The system of claim 16, further comprising: (a) a second battery bay having the same shape and orientation as said first battery bay within said adapter and (b) a second battery pack being identical to said first battery pack.

18. The system of claim 17, wherein said first battery bay has a wall with three indents and said battery bay clips are disposed at the outer indents of said three indents.

19. A resource metering system, comprising:
   (a) a resource meter that measures and provides information on the metered resource;
   (b) a meter socket connected to the resource to be measured;
   (c) an adapter interposed between said meter and said socket, having wireless communications means for transmitting messages;
   (d) means for sending said metered resource information from said meter to said adapter via electrically-isolated optical communications means.

20. The system of claim 19, wherein said optical communications means includes sending and receiving optical signals over free space.

21. The system of claim 20, wherein said resource is electricity.

* * * * *